United States Patent
Lee et al.

(10) Patent No.: US 8,564,738 B2
(45) Date of Patent: Oct. 22, 2013

(54) LIGHT EMITTING DEVICE AND METHOD OF MANUFACTURE

(75) Inventors: Sang-Youl Lee, Seoul (KR); So Jung Kim, Seoul (KR); June O Song, Seoul (KR); Kwang Ki Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/333,593

(22) Filed: Dec. 21, 2011

(65) Prior Publication Data

US 2012/0091492 A1    Apr. 19, 2012

Related U.S. Application Data

(63) Continuation of application No. 12/974,360, filed on Dec. 21, 2010, now Pat. No. 8,102,484.

(30) Foreign Application Priority Data

Dec. 21, 2009    (KR) .................. 10-2009-0128391

(51) Int. Cl.
    *G02F 1/1335*    (2006.01)

(52) U.S. Cl.
    USPC .................. 349/61; 349/56; 349/62; 349/63; 349/64

(58) Field of Classification Search
    USPC ................................ 349/56, 61, 62, 63, 64
    See application file for complete search history.

(56) References Cited

U.S. PATENT DOCUMENTS

| | | | |
|---|---|---|---|
| 6,995,401 B2 | 2/2006 | Yamada et al. | |
| 7,538,360 B2 | 5/2009 | Fudeta et al. | |
| 7,544,971 B2 | 6/2009 | Chen | |
| 7,579,220 B2 * | 8/2009 | Ohnuma et al. | 438/149 |
| 2006/0054919 A1 | 3/2006 | Matsuda et al. | |
| 2008/0038529 A1 | 2/2008 | Nakayama et al. | |
| 2009/0134416 A1 | 5/2009 | Lee | |
| 2009/0261370 A1 | 10/2009 | Jeong | |
| 2010/0102350 A1 | 4/2010 | Jeong | |
| 2010/0109032 A1 | 5/2010 | Jeong | |
| 2010/0123147 A1 | 5/2010 | Jeong | |
| 2010/0127297 A1 | 5/2010 | Jeong | |
| 2010/0163893 A1 | 7/2010 | Jeong | |
| 2010/0200884 A1 | 8/2010 | Lee et al. | |
| 2011/0114960 A1 * | 5/2011 | Lee et al. | 257/71 |
| 2011/0151606 A1 | 6/2011 | Jeong | |

FOREIGN PATENT DOCUMENTS

| | | |
|---|---|---|
| JP | 2004-193338 | 7/2004 |
| JP | 2005-072585 | 3/2005 |
| JP | 2008-060331 | 3/2008 |
| JP | 2008-211019 | 9/2008 |
| JP | 2011-129922 | 6/2011 |
| KR | 10-2005-0096741 | 10/2005 |
| KR | 2008-0033721 | 4/2008 |
| KR | 2008-0048707 | 6/2008 |
| KR | 10-2009-0053233 | 5/2009 |

OTHER PUBLICATIONS

Korean Office Action dated Jul. 30, 2010.

(Continued)

*Primary Examiner* — Jennifer Doan

(74) *Attorney, Agent, or Firm* — KED & Associates, LLP

(57) ABSTRACT

A light emitting device includes a conductive support layer, a light emitting structure layer on the conductive support layer, a first transparent conductive layer and a second transparent conductive layer disposed between the conductive support layer and the light emitting structure layer, and an electrode on the light emitting structure layer.

12 Claims, 8 Drawing Sheets

(56) References Cited

OTHER PUBLICATIONS

U.S. Office Action dated Jun. 22, 2011 for related U.S. Appl. No. 12/974,237, filed Dec. 20, 2010.
U.S. Office Action dated Dec. 8, 2011 for related U.S. Appl. No. 12/974,237.
Notice of Allowance dated Sep. 21, 2011 for parent U.S. Appl. No. 12/974,360.
Office Action dated Jun. 28, 2012 for U.S. Appl. No. 12/974,237.
Japanese Office Action dated Aug. 28, 2012.
Chinese Office Action dated Sep. 13, 2012.

* cited by examiner

LIGHT EMITTING DEVICE AND METHOD OF MANUFACTURE

CROSS-REFERENCE TO RELATED APPLICATIONS

This application is a continuation of U.S. application Ser. No. 12/974,360, filed on Dec. 21, 2010, now U.S. Pat. No. 8,102,484 which claims priority under 35 USC §119 of Korean Application No. 10-2009-0128391, filed on Dec. 21, 2009, incorporated herein by reference.

BACKGROUND

1. Field

One or more embodiments described herein relate to emission of light.

2. Background

A light emitting diode (LED) is a semiconductor device that converts current into light. The wavelength of emitted light varies based on the semiconductor material used, and more specifically based on the band-gap of the semiconductor material. LEDs are commonly used as light sources for displays, vehicles, and other illumination applications. However, improvements are needed in their design, performance, and manufacture.

DETAILED DESCRIPTION

Figure 1:
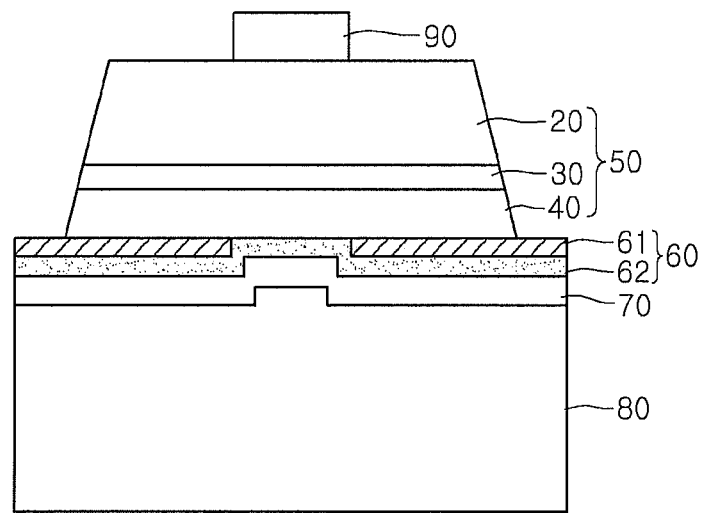
FIG. 1 is a view of a light emitting device according to a first embodiment.

FIG. 1 shows a first embodiment of a light emitting device that includes a conductive support layer 80, a reflective layer 70 on the conductive support layer 80, and a transparent conducting layer 60 that includes a first transparent conducting layer 61 and a second transparent conducting layer 62 on the reflective layer 70. The light emitting device also has a light emitting structure layer 50 that includes a semiconductor layer 20 of a first conductivity type, an active layer 30, and a semiconductor layer 40 of a second conductivity type on the transparent conducting layer 60, and an electrode 90 on the light emitting structure layer 50.

The conductive support layer 80 may be formed of at least one of Cu, Ti, Cr, Ni, Al, Pt, Au, W, or a conductive semiconductor material. The reflective layer 70 may be formed of a metal that includes at least one of Ag, AL, Cu, Ni or another material which has a high light reflectivity. The reflective layer 70 may be selectively formed, and it is not necessary that the reflective layer 70 is disposed between the conductive support layer 80 and the transparent conducting layer 60.

One portion of the first transparent conducting layer 61 vertically overlaps and may contact the light emitting structure layer 50, and the other portion of the first transparent conducting layer 61 is disposed outside the light emitting structure layer 50. A portion at which the first transparent conducting layer 61 is disposed outside the light emitting structure layer 50 (i.e., a peripheral portion of the first transparent conducting layer 61) may prevent fragments from being generated from reflective layer 70 or conductive support layer 80, for example, during an isolation etching process for dividing the light emitting structure layer 50 into unit chips.

One portion of the second transparent conducting layer 62 may be disposed under the first transparent conducting layer 61, and another portion of second transparent conducting layer 62 may be disposed between semiconductor layer 40 and reflective layer 70. The second transparent conducting layer 62 may have an area greater than that of the first transparent conducting layer 61. Also, a portion of the second transparent conducting layer 62 may protrude in a direction of the light emitting structure layer 50.

The transparent conducting layer 60 may be formed of at least one of transparent conducting oxide (TCO), transparent conducting nitride (TCN), or transparent conducting oxide nitride (TCON). Different materials may be used in other embodiments.

According to one embodiment, the transparent conducting layer 60 may be formed of a material having a light transmittance of about 50% or more and a surface resistance of about 10 Ω/sq or less. At least one of In, Sn, Zn, Cd, Ga, Al, Mg, Ti, Mo, Ni, Cu, Ag, Au, Sb, Pt, Rh, Ir, Ru, or Pd may be combined with at least one of O or N to faun the transparent conducting layer 60.

For example, the TCO may be one of indium-tin oxide (ITO), ZnO, aluminum doped zinc oxide (AZO), indium zinc oxide (IZO), antimony tin oxide (ATO), zinc indium-tin oxide (ZITO), Sn—O, In—O, or Ga—0, and the TCN may be at least one of TiN, CrN, TaN, or In—N. The transparent conducting oxide nitride may be one of indium-tin oxide nitride (ITON), ZnON, O—In—N, or indium zinc oxide nitride (IZON).

The first transparent conducting layer 61 and second transparent conducting layer 62 may be formed of the same material, and may be formed using the same or different deposition processes. These processes may include, for example, at least one of an evaporation process, a sputtering process, a spray prolysis process, a CVD process, a dip coating process, a reactive ion plating process, a wet coating process, a screen printing process, or laser techniques.

The first transparent conducting layer 61 and second transparent conducting layer 62 may have electrical properties different from each other according to the deposition processes, even though the first and second transparent conducting layers are formed of the same material. Also, the first transparent conducting layer 61 and second transparent conducting layer 62 may have electrical properties different from each other, even though the first and second transparent conducting layers are formed using the same deposition process (es) and material(s).

For example, the first transparent conducting layer 61 may be formed using a sputtering process and the second transparent conduction layer 62 may be formed of the same material as that of the first transparent conducting layer 61 using an evaporation process. In this case, the first transparent conducting layer 61 may be formed of a material having a work function greater than that of the second transparent conducting layer 62.

For example, when the first transparent conducting layer 61 is formed using the sputtering process, a plasma power may be set to a low value. When the second transparent conducting layer 62 is formed using the sputtering process, the plasma power may be set to a high value. In this case, the first transparent conducting layer 61 may have a work function greater than that of the second transparent conducting layer 62.

In the light emitting device according to the first embodiment, the first transparent conducting layer 61 and second transparent conducting layer 62 may have electrical properties different from each other with respect to the second conductivity type semiconductor layer 40 of the light emitting structure layer 50. For example, the second transparent conducting layer 62 may have current injection performance less than that of the first transparent conducting layer 61 with respect to the second conductivity type semiconductor layer 40. That is to say, the second transparent conducting layer 62 may have degraded electrical conductivity when compared to the first transparent conducting layer 61. Other differences in electrical properties may exist in different embodiments.

The first transparent conducting layer 61 may make ohmic-contact with semiconductor layer 40, and the second transparent conducting layer 62 may make schottky-contact with semiconductor layer 40. Thus, the most of current flowing between the electrode 90 and the conductive support layer 80 may flow into a region in which the first transparent conducting layer 61 contacts semiconductor layer 40.

At least portion of a region in which the second transparent conducting layer 62 contacts semiconductor layer 40 may vertically overlap electrode 90. Thus, the current flowing between electrode 90 and conductive support layer 80 may widely or mostly flow into the light emitting structure layer 50 through the first transparent conducting layer 61 and the semiconductor layer 40 to increase light efficiency of the light emitting device.

Since, according to one embodiment, the first transparent conducting layer 61 and the second transparent conducting layer 62 are formed of the same material, the first transparent conducting layer 61 may not be clearly distinguished from the second transparent conducting layer 62. However, in case where the transparent conducting layer 60 (i.e., the first transparent conducting layer 61 and the second transparent conducting layer 62) are formed of one or the same material, the first transparent conducting layer 61 and the second transparent conducting layer 62 may have electrical conductivities different from each other according to their regions. More particularly, a portion vertically overlapping the electrode 90 may have electrical conductivity less than that of a portion that does not overlap the electrode 90.

For example, a region in which the first transparent conducting layer 61 contacts the second conductivity type semiconductor layer 40 may be a first region having first electrical conductivity. Also, a region in which the second transparent conducting layer 62 contacts the second conductive type semiconductor layer 40 may be a second region having second electrical conductivity. Although the first transparent conducting layer 61 may not be clearly distinguished from the second transparent conducting layer 62, at least portion of the transparent conducting layer 60 vertically may overlap the electrode 90. Thus, the transparent conducting layer 60 may include the second region having relatively low electrical conductivity and the first region having electrical conductivity greater that that of the second region.

One or more layers of light emitting structure layer 50 may be formed from a GaN-based semiconductor material such as but not limited to GaN, InGaN, AlGaN, or InAlGaN. A different semiconductor material may be used in other embodiments.

For example, semiconductor layer 20 of the first conductivity type may include an N-type semiconductor layer formed of a semiconductor material having, for example, a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN, and doped with an N-type dopant such as Si, Ge, or Sn.

The active layer 30 is a layer in which electrons (or holes) injected through the first conductivity type semiconductor layer 20 meets with electrons (holes) injected through the second conductivity type semiconductor layer 40 to emit light by a band gap difference of an energy band depending on a formation material of the active layer 30.

The active layer 30 may have a single quantum well structure, a multi quantum well (MQW) structure, a quantum dot structure, or a quantum wire structure as well as one of a variety of other structures. The active layer 30 may be formed of a semiconductor material having a compositional formula of $In_xAl_yGa_{1-x-y}N$ ($0 \leq x \leq 1$, $0 \leq y \leq 1$, $0 \leq x+y \leq 1$). When the active layer 30 has an MQW structure, a plurality of well layers and a plurality of barrier layers may be stacked to form the active layer 30. For example, the active layer 30 may have a cycle of InGaN well layer/GaN barrier layer.

A clad layer (not shown) in which an N-type or P-type dopant is doped may be disposed above/below the active layer 30. The clad layer (not shown) may be realized by an AlGaN layer or an InAlGaN layer.

For example, the second conductivity type semiconductor layer 40 may be realized by a P-type semiconductor layer formed of a semiconductor material having, for example, a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, AlInN, InGaN, AlN, or InN, and doped with a P-type dopant such as Mg, Zn, Ca, Sr, or Ba.

According to one embodiment, the first conductivity type semiconductor layer 20 may include a P-type semiconductor layer and the second conductivity type semiconductor layer 40 may include the N-type semiconductor layer. Also, a third semiconductor layer (not shown) including an N-type or P-type semiconductor layer may be disposed on the second conductivity type semiconductor layer 40. Thus, the light emitting structure layer 50 may have at least one of an np junction structure, a pn junction structure, an npn junction structure, or a pnp junction structure. Also, impurities may be doped into the first conductivity type semiconductor layer 20 and the second conductivity type semiconductor layer 40 with uniform or non-uniform concentration.

Thus, the light emitting structure layer 50 including the first conductivity type semiconductor layer 20, the active layer 30, and the second conductivity type semiconductor layer 40 may have various structures, and is not limited to the structure of the light emitting structure layer 50 exemplified in the embodiment.

The electrode 90 may be disposed on the first conductivity type semiconductor layer 20 and may include at least one metal of Au, Al, or Pt to easily perform a wire bonding process.

The light emitting device according to the first embodiment may control the flow of the current into light emitting structure layer 50 through the transparent conducting layer 60.

Because the transparent conducting layer 60 has a light transmittance of about 50% or more, most of the light generated in active layer 30 may not be absorbed into the transparent conducting layer 60, but may be reflected by the reflective layer 70. Thus, because most of the light is emitted to the outside (externally), the light efficiency of the light emitting device may be improved.

Figure 2:
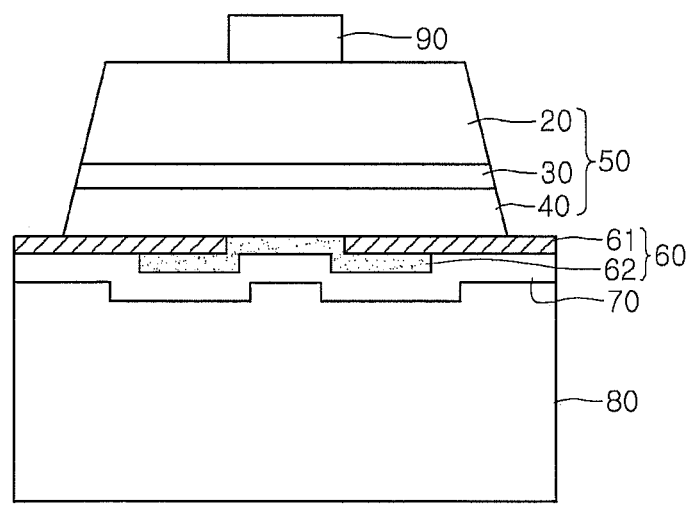
FIG. 2 is a view of a light emitting device according to a second embodiment.

FIG. 2 shows a second embodiment of a light emitting device which may have the same structure as the light emitting device according to the first embodiment except for the structure of transparent conducting layer 60.

More specifically, in the first embodiment, the second transparent conducting layer 62 may be disposed on substantially an entire region between the first transparent conducting layer 61 and reflective layer 70. However, in the second embodiment, second transparent conducting layer 62 is partially disposed between first transparent conducting layer 61 and reflective layer 70. Thus, a portion of the reflective layer 70 may directly contact the first transparent conducting layer 61.

Also, it is not necessary that the reflective layer 70 should be provided. For example, when reflective layer 70 is not disposed, a portion of a conductive support layer 80 may directly contact the first transparent conducting layer 61.

Figure 3:
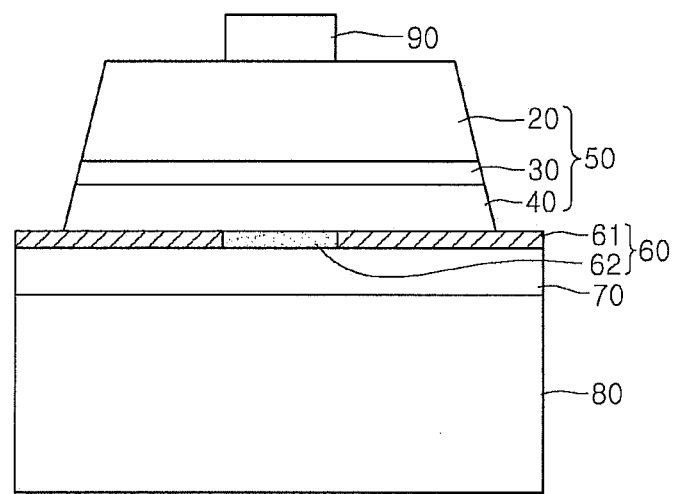
FIG. 3 is a view of a light emitting device according to a third embodiment.

FIG. 3 shows a third embodiment of a light emitting device which has a same or similar structure as the first embodiment except for the structure of the transparent conducting layer 60. In the first embodiment, the second transparent conducting layer 62 is disposed on an entire region between the first transparent conducting layer 61 and reflective layer 70. However, in the third embodiment, a second transparent conducting layer 62 is not disposed between a first transparent conducting layer 61 and a reflective layer 70.

Instead, the first transparent conducting layer 61 is disposed in substantially a same layer as the second transparent conducting layer 62 and the first transparent conducting layer 61 and the second transparent conducting layer 62 do not vertically overlap each other. Thus, a portion of reflective layer 70 may directly contact the first transparent conducting layer 61, and the remaining portion of the reflective layer 70 may not directly contact the second transparent conducting layer 62.

In the third embodiment, it is not necessary that the reflective layer 70 should be provided. For example, when reflective layer 70 is not disposed, a portion of a conductive support layer 80 may directly contact the first transparent conducting layer 61 and the remaining portion of the conductive support layer 80 may directly contact the second transparent conducting layer 62.

Figure 4:
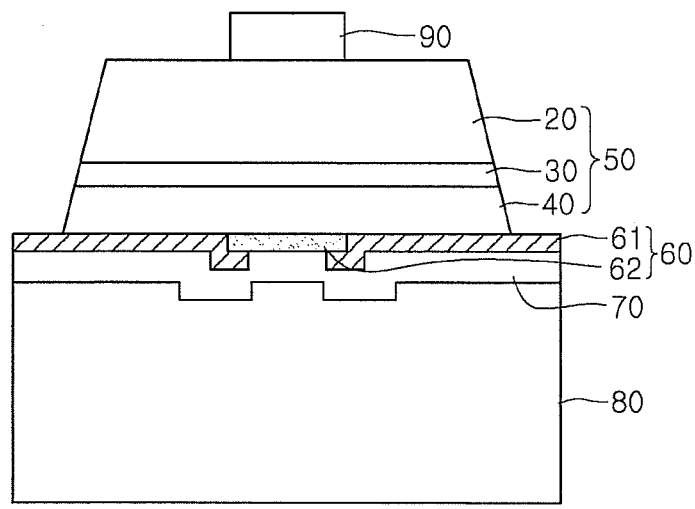
FIG. 4 is a view of a light emitting device according to a fourth embodiment.

FIG. 4 shows a fourth embodiment of a light emitting device which has a same or similar structure to the first embodiment except for a structure of a transparent conducting layer 60. In the first embodiment, the second transparent conducting layer 62 is disposed on an entire region between the first transparent conducting layer 61 and the reflective layer 70.

However, in the fourth embodiment, a second transparent conducting layer 62 is not disposed between a first transparent conducting layer 61 and reflective layer 70. Furthermore, the first transparent conducting layer 61 is disposed between a portion of the second transparent conducting layer 62 and reflective layer 70. Thus, a portion of reflective layer 70 may directly contact the first transparent conducting layer 61, and the remaining portion of the reflective layer 70 may not directly contact the second transparent conducting layer 62.

In this embodiment, it is not necessary that the reflective layer 70 be provided. For example, when the reflective layer 70 is not disposed, a portion of conductive support layer 80 may directly contact the first transparent conducting layer 61, and the remaining portion of conductive support layer 80 may directly contact the second transparent conducting layer 62.

Figure 5:
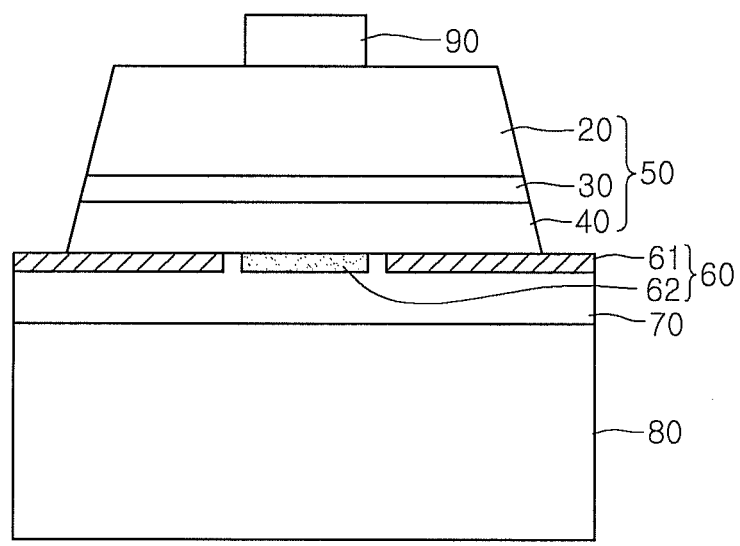
FIG. 5 is a view of a light emitting device according to a fifth embodiment.

FIG. 5 shows a fifth embodiment of a light emitting device which may have a same or similar structure as the first embodiment except for a structure of a transparent conducting layer 60. In the first embodiment, the second transparent conducting layer 62 is disposed on substantially an entire region between the first transparent conducting layer 61 and the reflective layer 70.

However, in the fifth embodiment, a second transparent conducting layer 62 is not disposed between the first transparent conducting layer 61 and the reflective layer 70, but rather may be disposed in substantially a same plane as the first transparent conducting layer 61. Moreover, first transparent conducting layer 61 and second transparent conducting layer 62 are spaced from each other, and portions of the reflective layer 70 are disposed between the first and second transparent conducting layer 61 and 62. Also, those portions of reflective layer 70 may directly contact light emitting structure layer 50.

In this embodiment, it is not necessary that the reflective layer 70 should be provided. For example, when reflective layer 70 is not disposed, a portion of a conductive support layer 80 may directly contact the first transparent conducting layer 61 and the second transparent conducing layer 62, and the remaining portion of the conductive support layer 80 may directly contact a light emitting structure 50.

FIGS. 6 to 11 show results of steps included in one embodiment of a method that may be used to manufacture any of the embodiments of the light emitting device.

Figure 6:
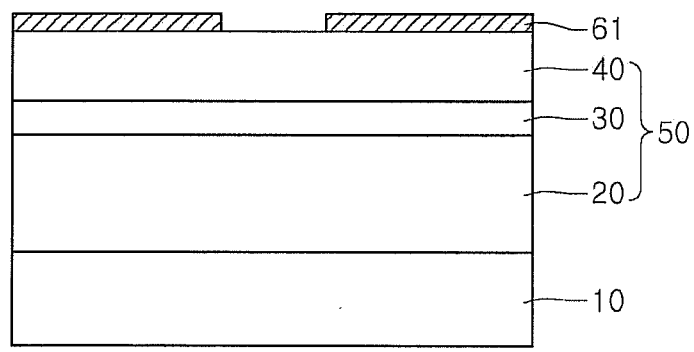
FIGS. 6 to 11 are views showing various stages produced by one embodiment of a method for manufacturing a light emitting device.

Referring to FIG. 6, a light emitting structure layer 50 including a semiconductor layer 20 of a first conductivity type, an active layer 30, and a semiconductor layer 40 of a second conductivity type is formed on a growth substrate 10. Also, a first transparent conducting layer 61 is formed on the light emitting structure layer 50.

Although not shown, an un-doped nitride layer (not shown) including a buffer layer (not shown) may be formed on the growth substrate 10, and then the first conductivity type semiconductor layer 20 may be formed on the un-doped nitride layer. The substrate 10 may be formed of one of sapphire ($Al_2O_3$), Si, SiC, GaAs, ZnO, or MgO, and the un-doped nitride layer may include a GaN-based semiconductor layer. For example, an un-doped GaN layer grown by injecting trimethylgallium (TMGa) gas together with hydrogen gas and ammonia gas into a chamber may be used as the un-doped nitride layer.

Silane gas ($SiH_4$) containing trimethylgallium (TMGa) gas and N-type impurities (e.g., Si) together with the nitrogen gas and the ammonia gas may be injected into the chamber to grow the first conductivity type semiconductor layer 20. Then, the active layer 30 and second conductivity type semiconductor layer 40 are formed on the first conductivity type semiconductor layer 20.

As previously indicated, the active layer 30 may have a single quantum well structure or a multi quantum well (MQW) structure. For example, the active layer 30 may have a stacked structure of an InGaN well layer/GaN barrier layer.

Bis(ethylcyclopentadienyl) magnesium ($EtCp_2Mg$){Mg ($C_2H_5C_5H_4)_2$} gas containing the trimethylgallium (TMGa) gas and P-type impurities (e.g., Mg) together with the nitrogen gas and the ammonia gas may be injected into the chamber to grow the second conductivity type semiconductor layer 40.

The first transparent conducting layer 61 is formed except at a partial region of the second conductivity type semiconductor layer 40. A region in which the first transparent conducting layer 61 is not formed is a region in which at least a portion of an electrode 90 (that will be described later) may vertically overlap. The first transparent conducting layer 61 may be formed using a sputtering process, for example.

Figure 7:
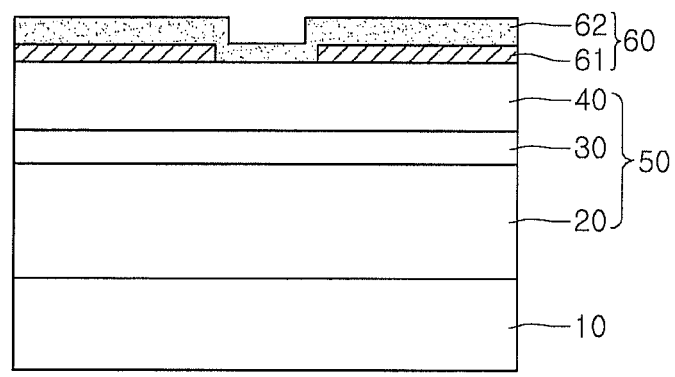

Referring to FIG. 7, a second transparent conducting layer 62 is formed on a partial region of the second conductive type semiconductor layer 40 and the first transparent conducting layer 61. The second transparent conducting layer 62 may be fanned, for example, using an evaporation process.

The first transparent conducting layer 61 and second transparent conducting layer 62 may include at least one of a transparent conducting oxide layer, a transparent conducting nitride layer, or a transparent conducting oxide nitride layer. Also, the first transparent conducting layer 61 and second transparent conducting layer 62 may be formed of a same material.

The first transparent conducting layer 61 may have first electrical conductivity, and the second transparent conducting layer 62 may have second electrical conductivity less than the first electrical conductivity.

Alternatively, the first transparent conducting layer 61 may have a first work function and the second transparent conducting layer 62 may have a second work function less than the first work function.

Alternatively, the first transparent conducting layer 61 may have first specific contact resistivity on a surface contacting the second conductivity type semiconductor layer 62, and the second transparent conducting layer 62 may have second specific contact resistivity greater than the first specific contact resistivity on the surface contacting the second conductivity type semiconductor layer 62.

Alternatively, the first transparent conducting layer 61 may make ohmic-contact with the second conductivity type semiconductor layer 40, and the second transparent conducting layer 62 may make schottky-contact with the second conductivity type semiconductor layer 40.

The method of forming the first transparent conducting layer 61 and second transparent conducting layer 62 may be changed to form the embodiments in FIGS. 1 to 5.

To form the first embodiment in FIG. 1, the first transparent conducting layer 61 is formed to expose a central portion thereof onto the second conductivity type semiconductor layer 40, and the second transparent conducting layer 62 is formed on a central portion of the second conductivity type semiconductor layer 40 and an entire region of the first transparent conducting layer 61.

To form the second embodiment in FIG. 2, the first transparent conducting layer 61 is formed to expose a central portion thereof onto the second conductivity type semiconductor layer 40, and the second transparent conducting layer 62 is formed on a central portion of the second conductivity type semiconductor layer 40 and a partial region of the first transparent conducting layer 61.

To form the third embodiment in FIG. 3, the first transparent conducting layer 61 is formed to expose a central portion thereof onto the second conductivity type semiconductor layer 40, and the second transparent conducting layer 62 is fondled on a central portion of the second conductivity type semiconductor layer 40.

To form the fourth embodiment in FIG. 4, the second transparent conducting layer 62 is formed on a central portion of the second conductivity type semiconductor layer 40, and the first transparent conducting layer 61 is formed on the second conductivity type semiconductor layer 40 and a partial region of the second transparent conducting layer 62.

To form the fifth embodiment in FIG. 5, the first transparent conducting layer 61 is formed on a central portion of the second conductivity type semiconductor layer 40, and the second transparent conducting layer 62 is formed on the second conductivity type semiconductor layer 40 to space the second transparent conducting layer 62 from the first transparent conducting layer 61.

Figure 8:
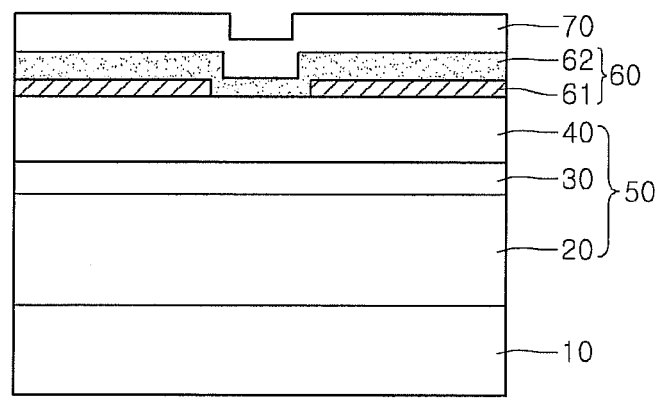
Figure 9:
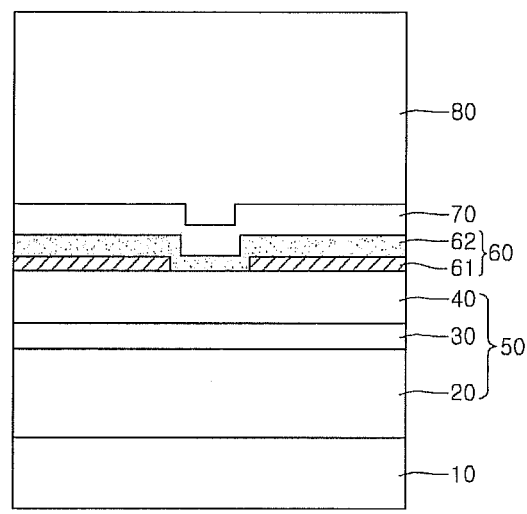

Referring to FIGS. 8 and 9, reflective layer 70 may be formed on transparent conducting layer 60, and conductive support layer 80 may be formed on reflective layer 70.

Figure 10:
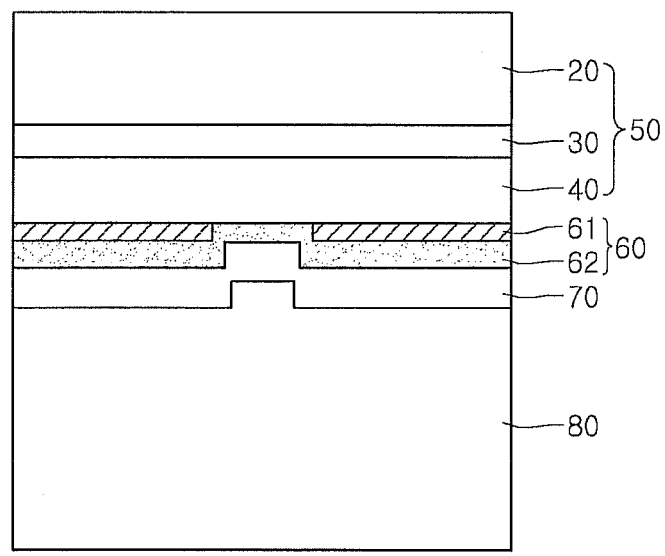
Figure 11:
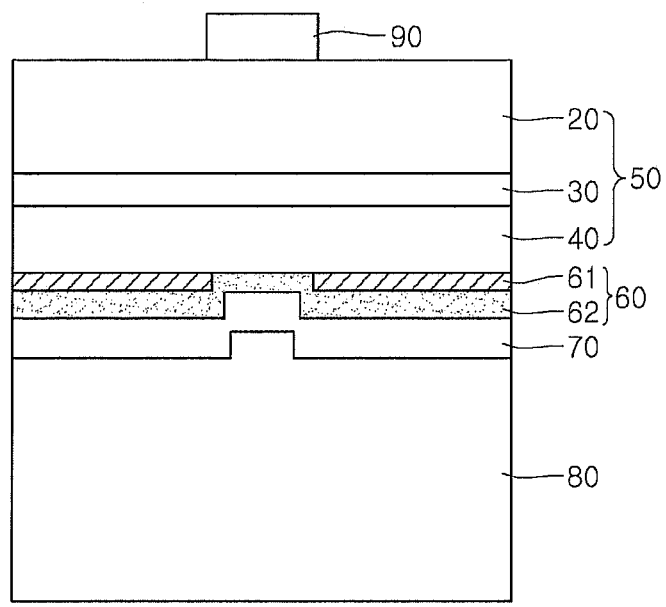

Referring to FIGS. 10 and 11, the growth substrate 10 is removed. Although not shown, after the growth substrate 10 is removed, an isolation etching process for dividing the light emitting device into unit chips may be performed to expose a portion of the first transparent conducting layer 61 upwardly, as shown in FIGS. 1 to 5.

An electrode 90 is formed on the first conductivity type semiconductor layer 20. The electrode 90 may be disposed to allow at least portion thereof to vertically overlap a region in which the second transparent conducting layer 62 contacts the second conductivity type semiconductor layer 40.

Figure 12:
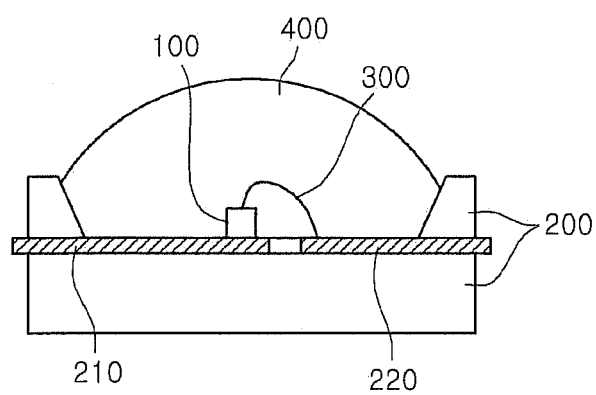
FIG. 12 is a view of an embodiment of a light emitting device package that includes any of the embodiments of the light emitting device.

FIG. 12 shows an embodiment of a light emitting device package which includes a main body 200, first and second electrode layers 210 and 220 disposed on the main body 200, a light emitting device 100 disposed on the main body 200 and electrically coupled to the first and second electrode layers 210 and 220, and a molding member 400 surrounding the light emitting device 100. The main body 200 may be formed of a silicon, synthetic resin, or metal material and an inclined surface may be formed around the light emitting device 100.

The first and second electrode layers 210 and 220 are electrically separated from each other to supply power to the light emitting device 100. Also, the first and second electrode layers 210 and 220 may reflect light generated in the light emitting device 100 to increase light efficiency. In addition, the first and second electrode layers 210 and 220 may discharge heat generated in the light emitting device 100.

The light emitting device 100 may be applied to the light emitting device shown in FIGS. 1 to 5, and the light emitting device 100 may be disposed on the main body 200 or the first or second electrode layer 210 or 220. Also, the light emitting device 100 may be electrically coupled to the first electrode layer 210 and/or the second electrode layer 220 through a wire 200. Since a vertical-type light emitting device 100 is described in this embodiment, only one wire 200 is used. However, multiple wires may be used in other embodiments and/or for other types of LEDs.

The molding member 400 may surround the light emitting device 100 to protect the light emitting device 100. Also, a phosphor may be contained in the molding member 400 to change a wavelength of the light emitted from the light emitting device 100.

A plurality of light emitting device packages may be arrayed on the substrate. Optical members such as a light guide plate, a prism sheet, a diffusion sheet, and/or a fluorescence sheet may be disposed on a path of the light emitted from the light emitting device package. The light emitting device package, substrate, and optical members may function as a backlight unit or a light unit. More specifically, lighting systems that include a backlight unit, lighting unit, an indicating device, a lamp, or a street lamp may be formed using the embodiments described herein.

Figure 13:
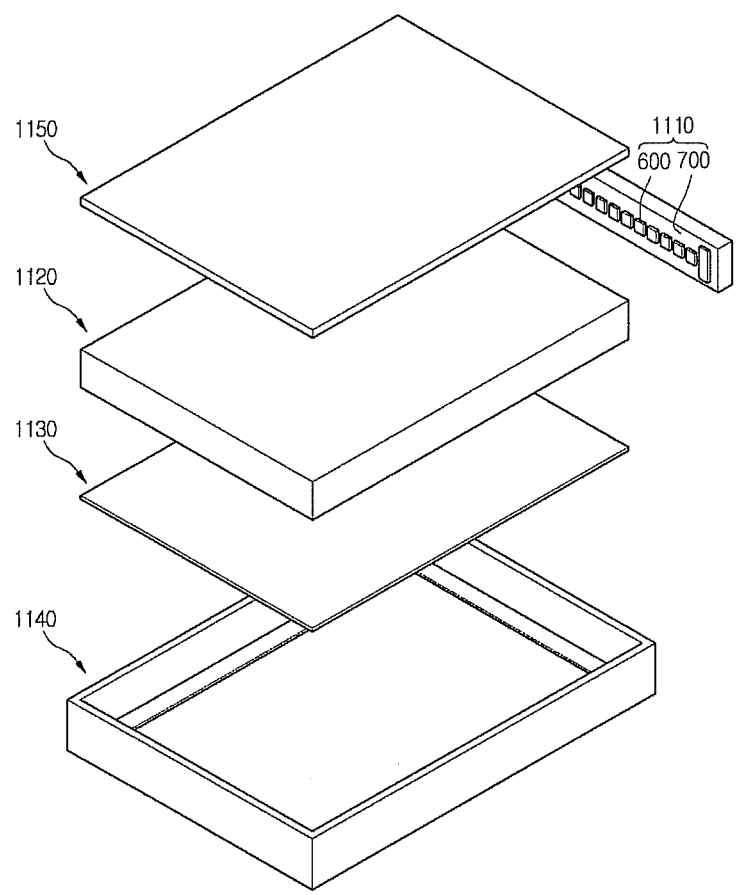
FIG. 13 is a view of an embodiment of a backlight unit that includes any of the embodiments of the light emitting device or the light emitting device package.

FIG. 13 shows one embodiment of a backlight unit 1100 having a bottom frame 1140, a light guide member 1120 disposed within the bottom frame 1140, and a light emitting module 1110 disposed on at least one side or an bottom surface of the light guide member 1120. A reflective sheet 1130 may be disposed below the light guide member 1120.

The bottom frame 1140 may have a box shape with an opened upper side to receive the light guide member 1120, light emitting module 1110, and reflective sheet 1130. The bottom frame 1140 may be formed of a metal or resin material, for example.

The light emitting module 1110 may include a substrate 700 and a plurality of light emitting device packages 600 mounted on the substrate 700. The plurality of light emitting device packages 600 may provide light to the light guide member 1120. In the light emitting module 1110, although the light emitting device package 600 is disposed on the substrate 700 as an example, another embodiment may be directly disposed.

As shown in FIG. 13, the light emitting module 1110 may be disposed on any one of a number of inner surfaces of bottom frame 1140. Thus, the light emitting module 1110 may provide light toward at least lateral surface of the light guide member 1120.

Also, the light emitting module 1110 may be disposed below the bottom frame 1140 to provide light toward an under surface of the light guide member 1120. This may be varied according to a design of the backlight unit 1100.

The light guide member 1120 may be disposed within the bottom frame 1140 and may receive the light provided from the light emitting module 1110 to produce planar light, and then guide the planar light to a liquid crystal panel (not shown).

For example, the light guide member 1120 may be a light guide panel (LGP). The LGP may be formed of one of a resin-based material such as polymethylmethacrylate (PMMA), a polyethylene terephthalate (PET) resin, a poly carbonate (PC) resin, a cyclic olefin copolymer (COC) resin, or a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, or a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet.

The light emitted from the light collection sheet may be randomly polarized light, and the bright enhancement sheet may enhance a degree of polarization of the light emitted from the light collection sheet. The light collection sheet may be, for example, a horizontal and/or vertical prism sheet, and the bright enhancement sheet may be a dual brightness enhancement film. The fluorescence sheet may be a light transmitting plate or film including a phosphor.

The reflective sheet 1130 may be disposed below the light guide member 1120 and may reflect the light emitted through the under surface of the light guide member 1120 toward a light emitting surface of the light guide member 1120. The reflective sheet may be formed of a material having superior reflectance, e.g., a PET, PC, or PVC resin.

Figure 14:
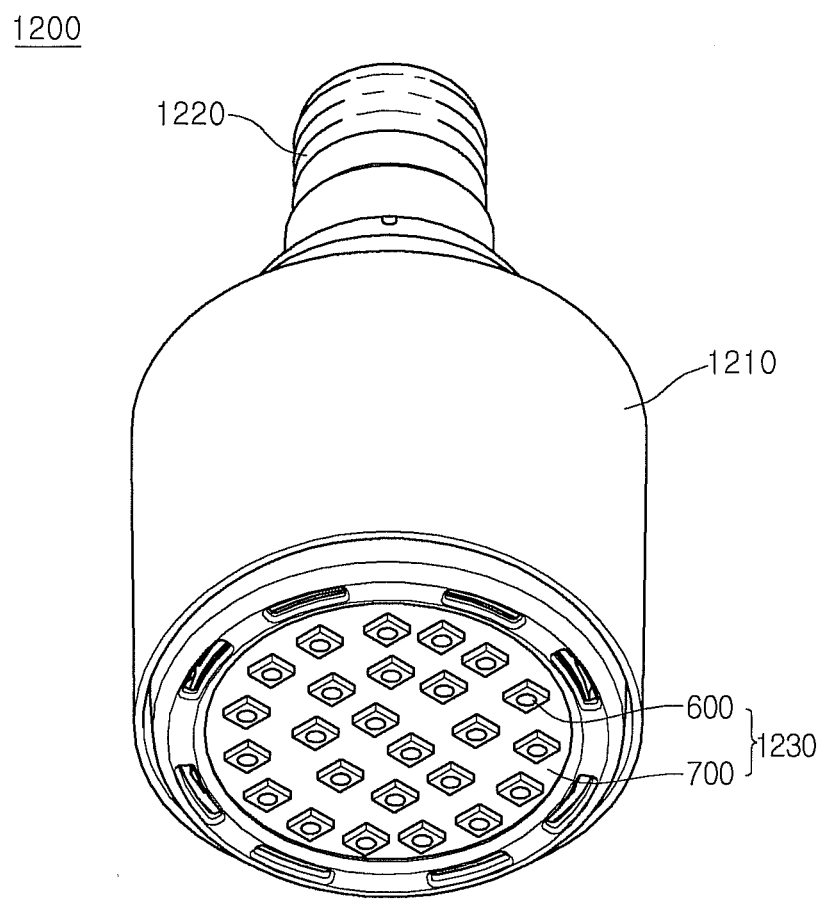
FIG. 14 is a view of an embodiment of a lighting unit that includes any of the embodiments of the light emitting device or the light emitting device package.

FIG. 14 shows one embodiment of a lighting unit 1200 that includes a light emitting device or light emitting device package according to any of the embodiments described herein. Referring to FIG. 14, the lighting unit 1200 may include a case body 1210, a light emitting module 1230 disposed on the case body 1210, a connection terminal 1220 disposed on the case body 1210 to receive a power from an external power source.

The case body 1210 may be formed of a material having good thermal dissipation properties, e.g., a metal material or a resin material.

The light emitting module 1230 may include a substrate 700 and at least one light emitting device package 600 mounted on the substrate 700. In the light emitting module 1110, although the light emitting device package 600 is disposed on the substrate 700 as an example, the light emitting device 100 may be directly disposed.

A circuit pattern may be printed on a dielectric to form the substrate 700. For example, the substrate 700 may include a printed circuit board (PCB), a metal core PCB, a flexible PCB, and a ceramic PCB. Also, the substrate 700 may be formed of an effectively reflective material or have a color on which light is effectively reflected from a surface thereof, e.g., a white or silver color.

At least one light emitting device package 600 may be mounted on the substrate 700 and may include at least one light emitting diode (LED). The LED may include colored LEDs, which respectively emit light having a red color, green color, blue color, and white color and an ultraviolet (UV) LED emitting UV rays.

The light emitting module 1230 may have various combinations of the LED to obtain color impression and brightness. For example, white, red, and green LEDs may be combined to form a high-color rendering index.

Also, a fluorescence sheet may be disposed on a path of light emitted from the light emitting module 1230. The fluorescence sheet changes a wavelength of the light emitted from the light emitting module 1230. For example, when light emitted from light emitting module 1230 emits light in a blue wavelength band, the fluorescence sheet may include a yellow phosphor. Thus, light emitted from the light emitting module 1230 passes through the fluorescence sheet to finally emit white light.

The connection terminal 1220 may be electrically coupled to the light emitting module 1230 to provide a power to the light emitting module 1230. Referring to FIG. 14, the connected terminal 1220 may be screw-coupled to an external power source in a socket manner, but different coupling arrangements may be used in other embodiments. For example, the connection terminal 1220 may have a pin shape and thus may be inserted into the external power source. Alternatively, the connection terminal 1220 may be connected to the external power source by a wire.

As previously described, at least one of the light guide member, diffusion sheet, light collection sheet, brightness enhancement sheet, and fluorescence sheet may be disposed on the path of light emitted from the light emitting module in order to obtain a desired optical effect.

Also, as previously described, because the lighting system may include a light emitting device package having superior light efficiency due to spreading characteristics of the current, the lighting system may have superior light efficiency.

One or more embodiments described herein provide a light emitting device having a new structure, a method of manufacturing the light emitting device, a package of the light emitting device package, and a lighting system that includes the light emitting device.

One or more embodiments described herein also provide a light emitting device having improved light efficiency, a method of manufacturing the light emitting device, a package for and a lighting system that includes the light emitting device.

In one embodiment, a light emitting device comprises: a conductive support layer; a transparent conducting layer comprising a first region having first electrical conductivity and a second region having second electrical conductivity less than the first electrical conductivity on the conductive support layer; a light emitting structure layer comprising a first conductive type semiconductor layer, a second conductive type semiconductor layer, and an active layer between the first conductive type semiconductor layer and the second conductive type semiconductor layer on the transparent conducting layer; and an electrode in which at least portion thereof is disposed in a region of the light emitting structure layer vertically overlapping the second region.

In another embodiment, a light emitting device package comprises: a main body; first and second electrode layers on the main body; a light emitting device electrically connected to the first and second electrode layers on the main body; and a molding member surrounding the light emitting device on the main body, wherein the light emitting device comprises: a conductive support layer; a transparent conducting layer comprising a first region having first electrical conductivity and a second region having second electrical conductivity less than the first electrical conductivity on the conductive support layer; a light emitting structure layer comprising a first conductive type semiconductor layer, a second conductive type semiconductor layer, and an active layer between the first conductive type semiconductor layer and the second conductive type semiconductor layer on the transparent conducting layer; and an electrode in which at least portion thereof is disposed in a region of the light emitting structure layer vertically overlapping the second region.

In another embodiment, a lighting system using a light emitting device as a light source comprises: a substrate; and at least one light emitting device on the substrate, wherein the light emitting device comprises: a conductive support layer; a transparent conducting layer comprising a first region having first electrical conductivity and a second region having second electrical conductivity less than the first electrical conductivity on the conductive support layer; a light emitting structure layer comprising a first conductive type semiconductor layer, a second conductive type semiconductor layer, and an active layer between the first conductive type semiconductor layer and the second conductive type semiconductor layer on the transparent conducting layer; and an electrode in which at least portion thereof is disposed in a region of the light emitting structure layer vertically overlapping the second region.

In another embodiment, a method of manufacturing a lighting system comprises: forming a light emitting structure layer on a growth substrate; forming a transparent ducting layer comprising a first transparent conducting layer contacting a first region of the light emitting structure layer and a second transparent conducting layer contacting a second region of the light emitting structure layer; forming a conductive support layer on the transparent conducting layer; removing the growth substrate; and forming an electrode on the light emitting structure layer exposed by removing the growth substrate to allow at least portion of the electrode to vertically overlap the second region, wherein the first transparent conducting layer and the transparent conducting layer are formed of the same material as each other using deposition processes or deposition process conditions different from each other.

In another embodiment, a method of making a light emitting device comprises: forming a first semiconductor layer; forming an active layer adjacent to the first semiconductor layer; forming a second semiconductor layer adjacent to the active layer, which is provided between the first and second semiconductor layers; forming a transparent conductive layer comprising a first transparent conductive region contacting a first region of the second semiconductor layer and a second transparent conductive region contacting a second region of the second semiconductor layer; forming a conductive support layer on the transparent conductive layer; and forming an electrode adjacent the first semiconductor layer to allow at least a portion of the electrode to vertically align with the second region, wherein the first and second semiconductor layers are of different conductivity types.

The first and second transparent conductive regions may be formed from the same or different class of materials, or from the same or different materials.

If formed from the same materials or same class or materials, the first and second transparent conductive regions may be formed using different deposition processes or different conditions of a same deposition. Also, one of the first or second transparent conductive regions are formed using a sputtering process and the other of the first or second transparent conductive regions are formed using an evaporation process. Also, the first and second transparent conductive regions are formed to have different work functions.

Alternatively, the first and second transparent conductive regions are formed from different materials.

Also, the first and second transparent conductive regions have different electrical conductivities, and/or different work functions, and/or different specific contact resistivities. One of the first or second transparent conductive regions make ohmic-contact with the second semiconductor layer wherein the other of the first or second transparent conductive regions make schottky-contact with the second semiconductor layer.

In addition, according to one variation, current flows to the second semiconductor layer through the first and second transparent conductive regions at different rates or in different amounts. An amount of current that flows to the second semiconductor layer through the first region is greater than an amount of current that flows to the second semiconductor layer through the second region.

The method may further include forming a reflective layer between the first and second conductive regions and the conductive support layer.

Also, in one embodiment, the first and second regions lie substantially in a same plane. In another embodiment, the second region is spaced from the first region. In another embodiment, the first region contacts the second region.

Also, the second region may be made from a material which extends between the first region and the conductive support layer. A sum of a width of the material which extends between the first region and the conductive support layer and a width of the second region is less than a width of at least one of the first semiconductor layer, the active layer, or the second semiconductor layer. Alternatively, the first region may be made from a material which extends between the second region and the conductive support layer.

It will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. The features of any one embodiment may be combined with one or more features of the remaining embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a conductive support layer;
a light emitting structure layer on the conductive support layer, wherein the light emitting structure layer comprises a first semiconductor layer, an active layer on the first semiconductor layer, and a second semiconductor layer on the active layer;
a first transparent conductive layer and a second transparent conductive layer disposed between the conductive support layer and the light emitting structure layer, wherein the first transparent conductive layer is disposed around the second transparent conductive layer, and wherein a first portion of the second transparent conductive layer is disposed under the first transparent conductive layer, and wherein a second portion of the second transparent conductive layer is disposed between the first semiconductor layer and the conductive support layer;
a reflective layer between the conductive support layer and the first and second transparent conductive layers; and
an electrode on the light emitting structure, wherein at least a portion of the electrode overlaps the second transparent conductive layer, wherein at least portion of the second transparent conductive layer contacts the first semiconductive layer at a central portion of the first semiconductive layer, and at least portion of the first transparent conductive layer contacts the first semiconductive layer at a peripheral portion of the first semiconductive layer, and wherein the reflective layer contacts the second transparent conductive layer and a peripheral portion of the first transparent conductive layer.

2. The light emitting device of claim 1, wherein the first portion of the second transparent conductive layer is partially disposed between the first transparent conductive layer and the conductive support layer.

3. The light emitting device in claim 1, wherein the first transparent conductive layer makes ohmic-contact with the first semiconductor layer, and the second transparent conductive layer makes Schottky-contact with the first semiconductor layer.

4. The light emitting device in claim 1, wherein the first transparent conductive layer and the second transparent conductive layer comprise different materials.

5. The light emitting device of claim 1, wherein the first and second transparent conductive layers comprise at least one of transparent conducting oxide (TCO), transparent conducting nitride (TCN), or transparent conducting oxide nitride (TCON).

6. The light emitting device of claim 5, wherein the TCO comprises one of indium-tin oxide (ITO), ZnO, aluminum doped zinc oxide (AZO), indium zinc oxide (IZO), antimony tin oxide (ATO), zinc indium-tin oxide (ZITO), Sn—O, In—O, or Ga—O, the TCN comprises at least one of TiN, CrN, TaN, or In—N, and the transparent conducting oxide nitride comprises one of indium-tin oxide nitride (ITON), ZnON, O—In—N, or indium zinc oxide nitride (IZON).

7. The light emitting device of claim 1, wherein the first and second transparent conductive layers comprise of a material having a light transmittance of about 50% or more and a surface resistance of about 10 Ω/sq or less.

8. The light emitting device of claim 1, wherein a portion of first transparent conductive layer is disposed outside of the light emitting structure layer.

9. The light emitting device of claim 1, wherein a portion of first transparent conductive layer is directly contacted with the reflective layer in a peripheral region of the light emitting structure layer.

10. The light emitting device in claim 1, wherein the first portion of the second transparent conductive layer is vertically overlapped with the first transparent conductive layer in a region corresponding with an outside of the electrode.

11. The light emitting device in claim 1, wherein the first transparent conductive layer has a first work function and the second transparent conductive layer has a second work function less than the first work function.

12. The light emitting device of claim 1, wherein a peripheral portion of the second transparent conductive layer is disposed between the reflective layer and the first semiconductive layer.

* * * * *